United States Patent [19]

Katoh

[11] Patent Number: 5,041,882

[45] Date of Patent: Aug. 20, 1991

[54] HETEROJUNCTION BIPOLAR TRANSISTOR

[75] Inventor: Riichi Katoh, Yokohama, Japan

[73] Assignee: Kabushiki Kaisha Toshiba, Kawasaki, Japan

[21] Appl. No.: 549,928

[22] Filed: Jul. 9, 1990

[30] Foreign Application Priority Data

Jul. 10, 1989 [JP] Japan .................................. 1-177630

[51] Int. Cl.$^5$ ...................... H01L 29/205; H01L 29/72
[52] U.S. Cl. ......................................... 357/16; 357/34
[58] Field of Search .................................. 357/16, 34

[56] References Cited

U.S. PATENT DOCUMENTS

| 4,924,283 | 5/1990 | Ohshima ............................... 357/16 |
| 4,933,732 | 6/1990 | Katoh et al. .......................... 357/16 |
| 4,958,208 | 9/1990 | Tanaka .................................. 357/16 |

OTHER PUBLICATIONS

H. Kroemer, "Heterostructure Bipolar Transistors and Integrated Circuits", Proceedings of the IEEE, vol. 70, No. 1, Jan. 1982, pp. 13-25.

Y.-K. Chen et al., "Subpicosecond InP/InGaAs Heterostructure Bipolar Transistors", IEEE Electron Device Letters, vol. 10, No. 6, Jun. 1989, pp. 267-269.

R. Katoh et al., "Quest for Higher Performance HBTs, AlInAs/GaInAs vs. InP/GaInAs: Monte Carlo Study", Extended Abstracts of the 21st Conference on Solid State Devices and Materials, 1989, pp. 293-296.

*Primary Examiner*—Gene M. Munson
*Attorney, Agent, or Firm*—Finnegan, Henderson, Farabow, Garrett and Dunner

[57] ABSTRACT

A heterojunction bipolar transistor comprises an emitter layer made of a material having a band gap larger than that of a base layer and which includes a region subjected to a composition variation so that the band gap is made gradually smaller from inside of the emitter layer into inside of the base layer toward a base/collector junction direction. In the transistor, the emitter layer is made of an InP composition, the base layer is made of a gaInAsP composition which is lattice matched with the InP composition, and a composition ratio $\beta$ of P to As in a base/emitter junction satisfies an inequality relationship $0.3 \leq \beta \leq 0.7$.

15 Claims, 9 Drawing Sheets

HETEROJUNCTION BIPOLAR TRANSISTOR

BACKGROUND OF THE INVENTION

1. Field of the Invention

The present invention relates to heterojunction bipolar transistors in which an emitter region is made of InP having a wide band gap, a base region is made of GaInAsP having a narrow band gap, and an emitter/base region is made of a material with a band gap becoming gradually smaller from the emitter side to the collector side.

2. Description of the Related Art

Heterojunction bipolar transistors (HBTs) have been considered to have promising prospects in the field of microwave and high speed logical operations because of their excellent high frequency operations and switching performance.

To evaluate the operation speed of a bipolar transistor, a cut-off frequency $f_T$ is generally used. In an npn type transistor, the cut-off frequency is expressed in terms of a reciprocal of the transit time of electrons within the transistor device. Therefore, when it is desired to obtain a high cut-off frequency $f_T$, it is necessary to shorten the electron transit time.

The electron transit time $\tau$ is expressed in terms of a sum of an emitter charging time $\tau_E$, a base transit time $\tau_B$, a collector transit time and a collector charging time $\tau_C$.

The base transit time $\tau_B$ is constant regardless of a current density. The emitter charging time $\tau_E$ is decreased as the current density increases. When the transistor is operated at a high current density higher than the latter part of the order of $10^4 A/cm^2$ or $10^5 A/cm^2$, the emitter charging time $\tau_E$ takes a small value far below 1 psec.

Conventionally, major researches and studies on the HBTs have been directed to such a type of HBTs that use AlGaAs/GaAs material system as compound semiconductor materials. Recently, however, for the purpose of obtaining a higher speed and better performance, HBTs using the InP/GaInAsP material system have become actively studied.

In the InP/GaInAsP HBT, the emitter layer is made of InP having a wide band gap, the base layer is made of GaInAsP having a narrow band gap, the collector layer is made of GaInAsP or InP, the crystal mixture ratio of the respective layers being selected to be sequentially lattice matched with an InP substrate.

When the InP/GaInAsP material system is employed, it is possible to enlarge current amplification factor because InP has a small intrinsic surface recombination rate. Since the electron mobility is large within InGaAs and the band separation energy between Γ and L points in the band structure of InP is larger than that in GaAs, the velocity overshoot can be effectively utilized and thus the transistor can be operated at a higher speed. In addition, since the band gap of the InGaAs is smaller than that of the GaAs, the transistor can be operated with low power consumption. Therefore, it is generally considered that InGaAs is advantageous over GsAs in obtaining a high performance device.

Conventionally, for the purpose of simplifying epitaxial growth, the HBT using the InP/GaInAsP material system arranged as shown in FIG. 2, in which an emitter layer is made of InP, a base layer is made of InGaAsP, a collector layer is made of InP, and semiconductor composition abruptly varies at the interfaces between the respective layers. More in detail, the conventional heterojunction bipolar transistor comprises a semi-insulating InP substrate 1, an n+ type InP layer 2 as a collector contact layer, an n− type InP layer 3 as a collector layer, a p+ type $Ga_{0.47}In_{0.53}As$ layer 16 as a base layer, an n type InP layer 7 and an n type $Ga_{0.47(1-\beta)}In_{0.53+0.47\beta}As_{1-\beta}P_\beta$ layer 8 $(1.0 \geq \beta \geq 0)$ both forming an emitter layer, an n+ type $Ga_{0.47}In_{0.53}As$ layer 9 as an emitter cap layer, these layers being sequentially laminated on the InP substrate 1 in this order. In addition, an emitter electrode 10, a base electrode 11 and a collector electrode 12 are formed in such a manner as to contact with these layers. In the drawing, reference numeral 13 denotes an insulating layer for isolation between elements, 14 denotes an insulating layer for isolation between electrodes, and 15 denotes a silicon oxide film.

With such an "abrupt" heterojunction where the semiconductor composition varies abruptly at the interface, when electrons flow from the emitter to the base, the heterojunction functions as a potential barrier, whereby the ON voltage of the transistor becomes high. Further, electrons flowing from the base to the collector are blocked by the potential barrier caused by heterojunction at the base/collector interface, thereby to greatly reduce the current amplification factor.

In order to remove the potential barrier in the conduction band of GaAs HBT or the like HBT, a so-called composition grading is employed in which the crystal mixture ratio of the semiconductor is gradually changed. With the composition grading, a smooth conduction band configuration is obtained in which electrons can be smoothly moved from the emitter to the collector.

For the purpose of reducing the base resistance, the impurity concentration of the base region is determined as high as possible. This, however, causes the mobility of electrons in the base region to become very small, whereby the electron transit time in the base region becomes large and thus the operation speed is reduced. In order to reduce the base transit time while the impurity concentration in the base region is kept at a high level, a method has been employed in which the semiconductor composition of the base layer is gradually varied to establish an electric field for acceleration of electrons moving within the base region.

However, although the above method of providing the electron accelerating electric field by varying the semiconductor composition of the base region is indispensable for realizing a higher-performance HBT, there has been proposed only such an HBT of InP/GaInAsP material system where the base layer has a uniform impurity distribution and a uniform semiconductor composition. Accordingly, as far as the above method is concerned, it is not known, for example, the spatial distribution of the semiconductor composition in this material system and the influence of the distribution on the performance of the element.

Further, in the HBT of the InP/GaInAs material system, how to provide a semiconductor composition grading at emitter/base and base/collector junctions, how to provide an electron accelerating electric field by varying the composition of the base region and how to vary the base composition are not known at present.

Under the above discussed situation, the prior art HBT of the InP/GaInAs material system could not have a satisfactory operation speed even though the emitter layer is made of InP which provides a large current amplification factor because of its small intrinsic surface recombination rate and the base layer is made of InGaAs which provides a high speed operation because of the large electron mobility within the InGaAs, it is impossible to obtain a sufficient operation speed.

SUMMARY OF THE INVENTION

In view of the above circumstances, it is an object of the present invention to provide a high performance InP/GaInAs HBT.

More specifically, the present invention is directed to maximizing a cut-off frequency $f_T$ which is one of parameters which influences the operation speed of a transistor, and aims at providing optimum conditions to the semiconductor composition of a base/emitter region in the InP/GaInAs material system for shortening the emitter charging time and the base transit time when a current density is varied.

In accordance with an aspect of the present invention, the above object is attained by a heterojunction bipolar transistor which is characterized in that the emitter layer is made of InP having a wide band gap, a part of the emitter layer and the base layer are made of GaInAsP which is lattice matched with InP and which has a band gap becoming gradually smaller from the part of the emitter toward a base/collector junction, and a composition ratio $\beta$ of P to As in a base/emitter junction satisfies an inequality relationship of $0.3 \leq \beta \leq 0.7$.

With the above structure, in the trade-off between the emitter charging time $\tau_E$ and the base transit time $\tau_B$, the optimum conditions of the composition of the base layer and the composition of the base/emitter junction in the InP/GaInAsP HBT to minimize the sum ($\tau_E + \tau_B$) are found through simulation.

More in detail, in accordance with the heterojunction bipolar transistor of the present invention, a region in the emitter layer contacted with the base layer is subjected to the semiconductor composition grading in which the band gap is gradually decreased from the emitter toward the base, the semiconductor composition of the base layer is varied so that the band gap is gradually decreased from the emitter side of the base layer to the collector side to thereby establish an electron accelerating electric field within the base layer while the semiconductor composition at the base/emitter junction satisfies the above relationship.

Explanation will now be directed to how to derive the above relationship in accordance with the present invention.

Since an epitaxially grown layer must be obtained, it is necessary for the base layer to have a good lattice matching composition with the InP emitter layer. From this viewpoint, $Ga_{0.47(1-\beta)}In_{0.53+0.47\beta}As_{1-\beta}P_\beta$ is selected as the composition of GaInAsP that is regarded as having the best lattice matching with respect to InP. Then, the optimum value for $\beta$ is calculated by varying the parameter $\beta$.

FIG. 3 shows a profile of the composition ratio $\beta$ of P in the InP/GaInAsP HBT. In the drawing, the parameter $\beta$ is defined as the $Ga_{0.47(1-\beta)}In_{0.53+0.47\beta}As_{1-\beta}P_\beta$ under a condition that this material is lattice matched with the InP, and the parameter varies from 0 to 1. When $\beta=0$, $Ga_{0.47}In_{0.53}As$ is obtained, while when $\beta=1$, InP is obtained. Composition grading is applied to the InP emitter layer at a depth position of 500Å from its base end so that the band gap is decreased from the emitter to the base in the composition grading area. Further, composition grading is also applied to the base layer such that the band gap is continuously varied within the base layer from its emitter end toward its collector end until $Ga_{0.47}In_{0.53}As$ is obtained at the base/collector junction.

FIG. 4 shows an energy band diagram of the semiconductor composition described above in its thermal equilibrium condition, in which vertical axis represents electron energy.

In the drawing, as the value of $\beta$ increases, the gradient of the conduction band in the base region becomes large and the electric field for accelerating electrons is correspondingly increased.

It will be clear from FIG. 4 that variation in the value of $\beta$ causes substantially no change in the potential barrier to holes when viewed in a direction from the base to the emitter, whereas the potential barrier to holes varies with the value of $\beta$ when viewed from the emitter to the base, so that when $\beta=0$, the potential barrier has a height corresponding to the band gap of the $Ga_{0.47}In_{0.53}As$ and when $\beta=1$, the potential barrier has a height corresponding to the band gap of the InP.

As the value of $\beta$ is increased, the base/emitter junction becomes close to a homogeneous diode having a wide InP band gap, so that the ON voltage of the transistor becomes high. As the ON voltage of the transistor becomes higher, the emitter capacitance becomes larger in the same current density, resulting in the ling emitter charging time and the extremely slow operation speed of the transistor.

As described above, as the composition ratio $\beta$ of P at the base/emitter junction is increased, the base transit time is shortened, but the emitter charging time becomes long, thus creating a trade-off condition.

In accordance with the present invention, by carrying out Monte Carlo simulation in which the composition ratio $\beta$ of P to As at the base/emitter junction is changed as shown in FIG. 3, the emitter charging time $\tau_E$ and the base transit time $\tau_B$ are obtained and the optimum conditions are determined considering the trade-off relationship.

FIG. 5 show the results of the Monte Carlo simulation, in which $\tau_E$ and $\tau_B$ are given when the current density is $1 \times 10^5 A/cm^2$. In the drawing, small circles denote $\tau_B$ and dots denote $\tau_E + \tau_B$. As clear from the drawing, $\tau_E + \tau_B$ takes its minimum value within a range of $\beta$ between 0.3 and 0.7. When $\beta$ is within this range, an increase in the emitter charging time can be suppressed and the base transit time can be made sufficiently small, whereby a superhigh speed InP/GaInAsP HBT can be realized.

As described above, the heterojunction bipolar transistor of the present invention is made of material systems which are lattice matched with the InP substrate. That is, the emitter region is made of InP having a wide band gap, the base region is made of GaInAsP having a narrow band gap, the emitter/base region has a portion whose composition is varied such that the band gap becomes smaller from the emitter side to the collector side, and when the composition of the emitter/base junction is selected to be $Ga_{0.47(1-\beta)}In_{0.53+0.47\beta}As_{1-\beta}P_\beta$, the composition ratio $\beta$ of P is determined to satisfy an inequality relationship of $0.3 \leq \beta \leq 0.7$. As a result, in the trade-off between the emitter charging time $\tau_E$ and the base transit time $\tau_B$, it becomes possible to minimize the $\tau_E + \tau_B$ and therefore it is possible to provide an extremely high speed InP/GaInAsP series HBT. Preferably, the composition ratio $\beta$ is 0.5.

In the present embodiment, the composition ratio $\beta$ is set to be 0.5, the reason of which is as follows.

FIG. 8 is a graph illustrating how the transit time $\tau_E + \tau_B$ changes with the composition $\beta$ for different emitter concentration $N_E$, base concentration $N_B$ and composition grading width $W_G$ within the emitter. In FIG. 5, the range of $\beta$ is obtained while the emitter and base concentrations and the composition grading width within the emitter are fixed at $5 \times 10^{17} cm^{-3}$, $1 \times 10^{19} cm^{-3}$ and 500Å, respectively. In FIG. 8, on the other hand, a check is first carried out whether or not $\beta$ falls within the aforementioned range when these factors are varied. In FIG. 8, small circles correspond to the data in FIG. 5, which are used as reference data. When the emitter concentration $N_E$ is varied, this causes substantially no variation of the $\tau_E + \tau_B$ and the $\tau_E + \tau_B$ curve is substantially flat in the $\beta$ range of $0.3 \leq \beta \leq 0.7$. When the base concentration $N_B$ is increased, $\tau_E + \tau_B$ becomes larger than the reference data in all the $\beta$ range, $\tau_E + \tau_B$ takes its minimum value in the vicinity of $\beta = 0.5$ and abruptly increases in a range of $\beta \geq 0.5$ as will be easily observed from FIG. 8. The minimum value of $\tau_E + \tau_B$ exists in the $\beta$ range of $0.3 \leq \beta \leq 0.7$ and thus satisfies the aforementioned condition. When the composition grading width $W_G$ is made smaller, $\tau_E + \tau_B$ becomes smaller than the reference data in substantially all the $\beta$ range, and takes its minimum value in the vicinity of $\beta = 0.5$. However, $\tau_E + \tau_B$ varies more greatly in a range of $0.3 \leq \beta \leq 0.5$ than in a range of $\beta \geq 0.5$ as will be seen from FIG. 8. Even in this case, the minimum value of $\tau_E + \tau_B$ exists in the $\beta$ range of $0.3 \leq \beta \leq 0.7$ and thus satisfies the aforementioned condition.

It will be appreciated from the above consideration that $\beta$ always exists within the aforementioned $\beta$ range for possible variations in the parameters and $\tau_E + \tau_B$ can take its minimum value for any parameters so long as $\beta$ is set to be in the vicinity of 0.5. From the above consideration, the P composition ratio $\beta$ is set to be 0.5 in the present embodiment.

DESCRIPTION OF THE PREFERRED EMBODIMENTS

An embodiment of the present invention will be detailed with reference to the attached drawings.

Figure 1:
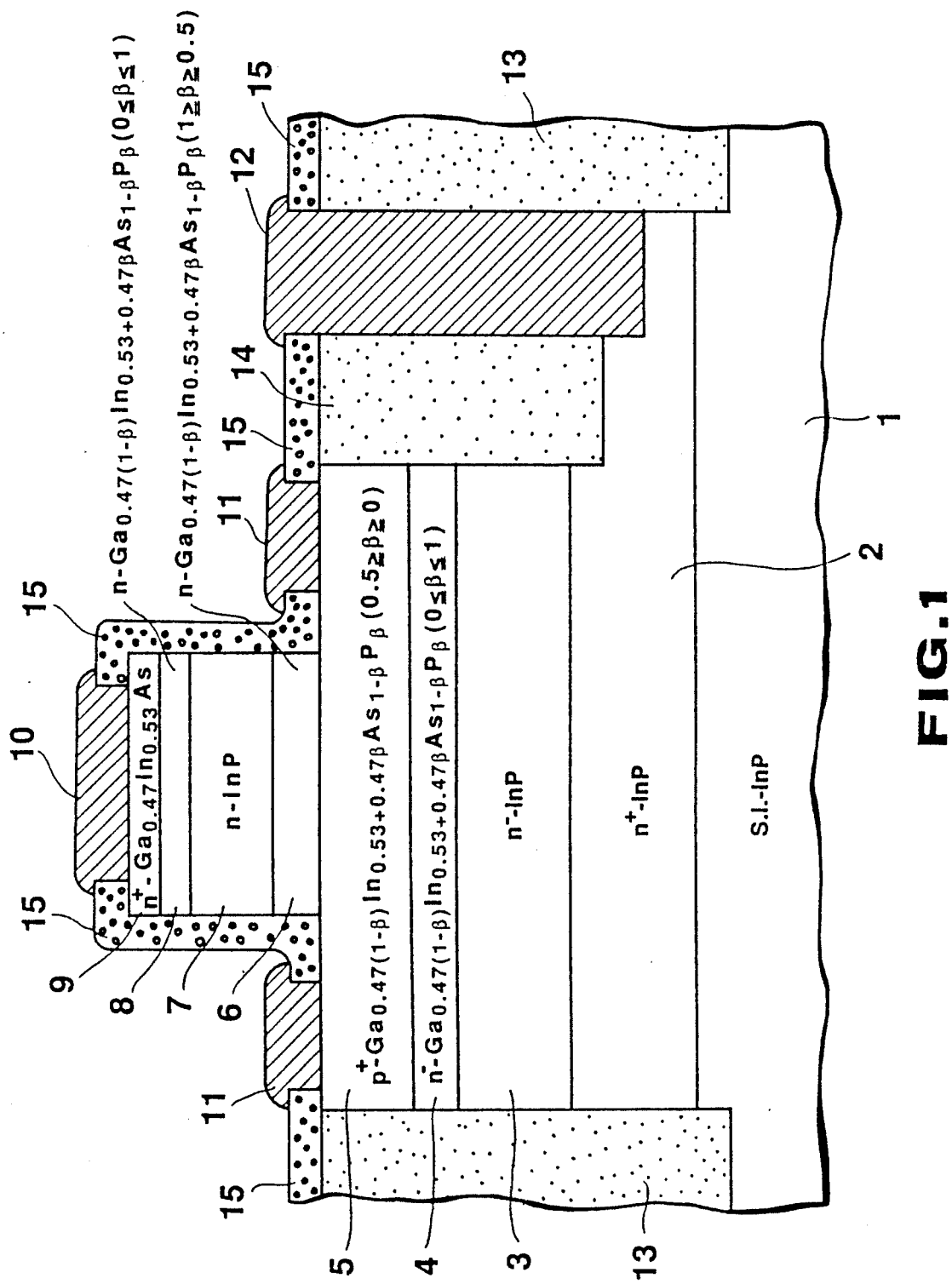
FIG. 1 is a cross-sectional view of a heterojunction bipolar transistor in accordance with an embodiment of the present invention.
Figure 2:
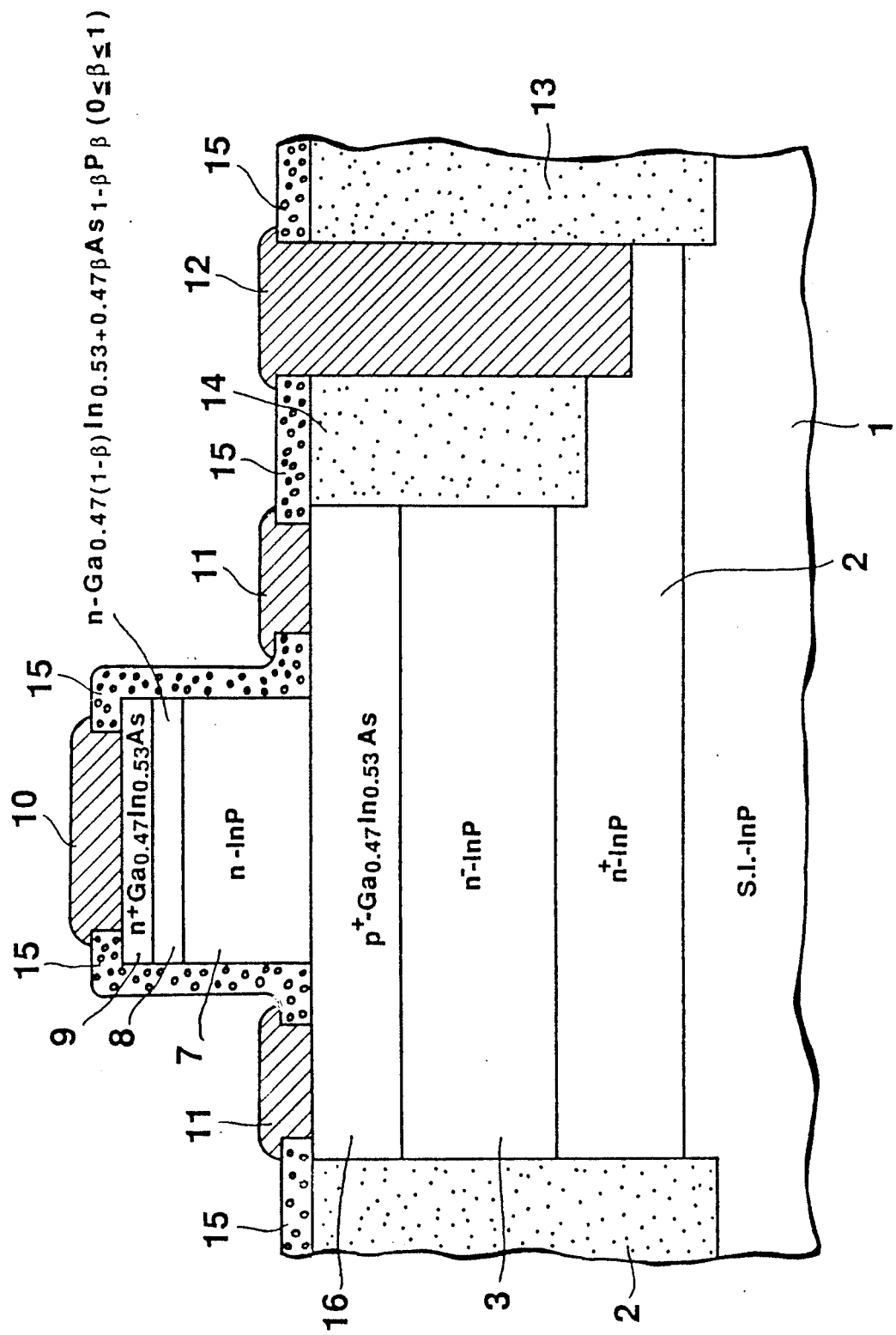
FIG. 2 is a cross-sectional view of a prior art heterojunction bipolar transistor.
Figure 3:
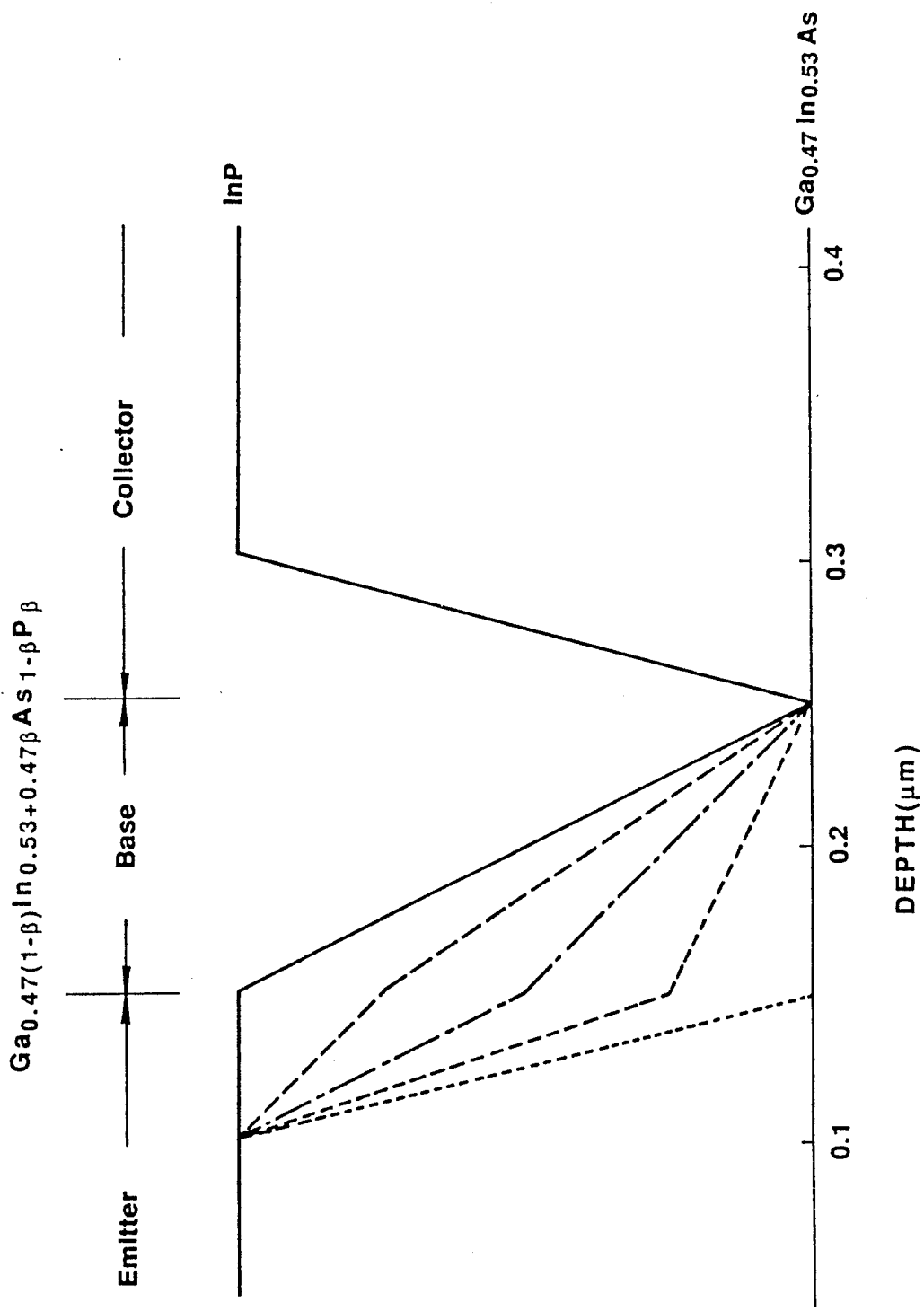
FIG. 3 is a graph illustrating the composition ratio $\beta$ of P in the heterojunction bipolar transistor in the film thickness direction.
Figure 4:
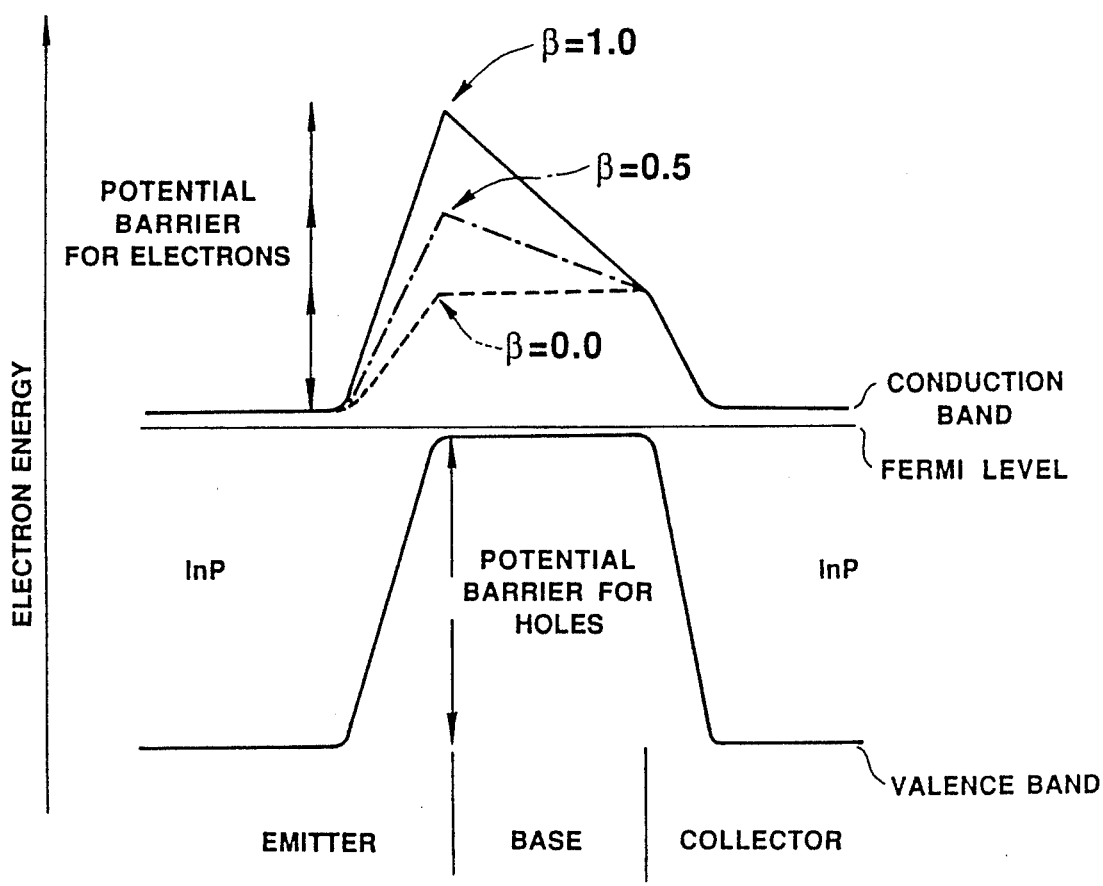
FIG. 4 schematically shows the band structure of the heterojunction bipolar transistor for different composition ratio $\beta$.
Figure 5:
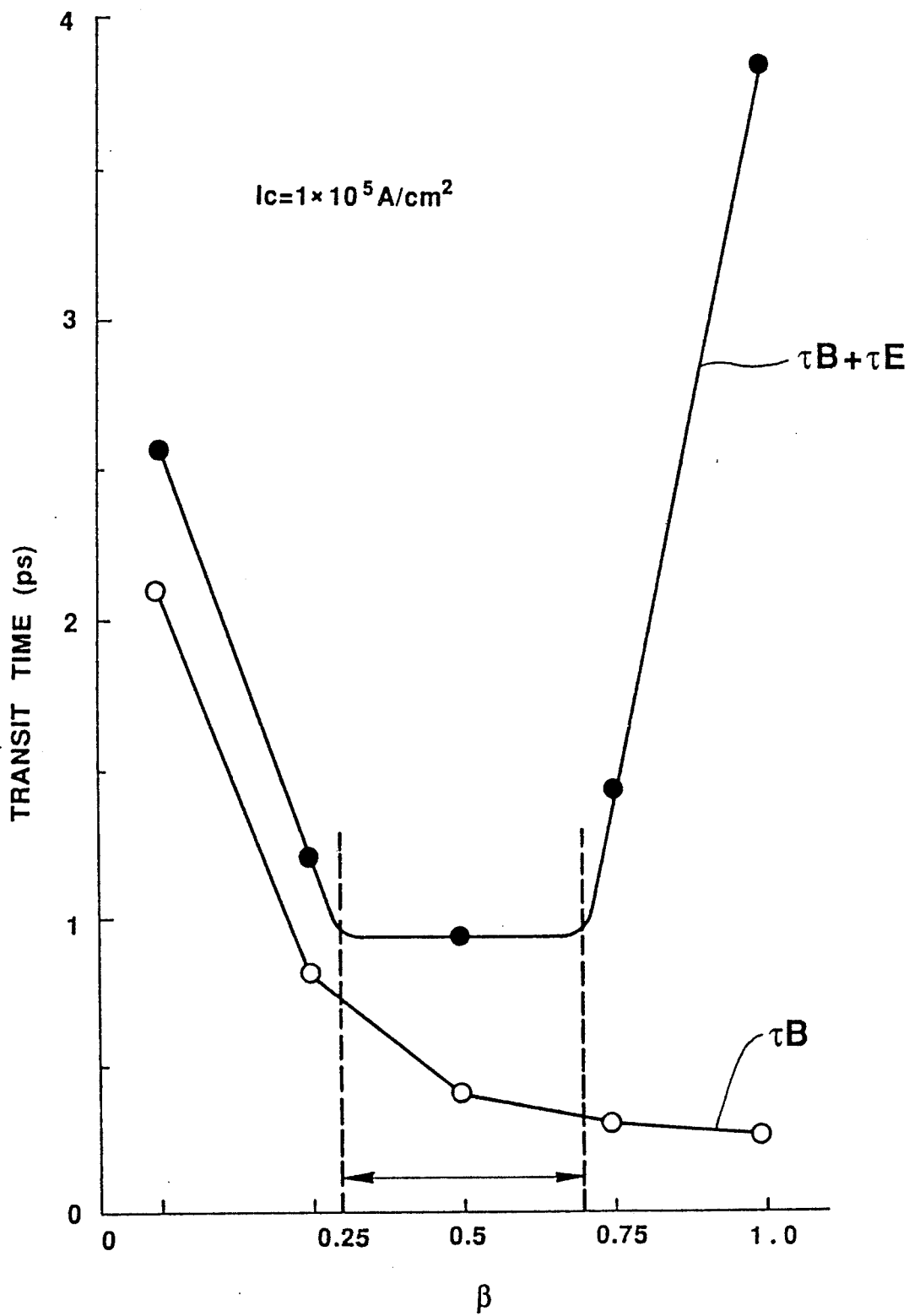
FIG. 5 is a graph of the composition ratio $\beta$ vs. the emitter charging time and the base transit time at a base/emitter junction of the heterojunction bipolar transistor.

Referring first to FIG. 1, there is shown a cross-sectional view of a heterojunction bipolar transistor in accordance with an embodiment of the present invention.

The illustrated heterojunction bipolar transistor comprises a semi-insulating InP substrate 1, an n+type InP layer 2 as a collector contact layer, an n−type InP layer 3 as a collector layer formed on the InP layer 2, an n−type $Ga_{0.47(1-\beta)}In_{0.53+0.47\beta}As_{1-\beta}P_\beta$ layer 4 as another collector layer a p+type $Ga_{0.47(1-\beta)}In_{0.53+0.47\beta}As_{1-\beta}P_\beta$ layer 5 ($0 \leq \beta \leq 0.5$) as a base layer, an n type $Ga_{0.47(1-\beta)}In_{0.53+0.47\beta}As_{1-\beta}P_\beta$ layer 6 ($0.5 \leq \beta \leq 1.0$) as an emitter layer, an n type InP layer 7 as another emitter layer, an n type $Ga_{0.47(1-\beta)}In_{0.53+0.47\beta}As_{1-\beta}P_\beta$ layer 8 ($1.0 \geq \beta \geq 0$) as a further emitter layer formed on the layer 7, and an n+type $Ga_{0.47}In_{0.53}As$ layer 9 as an emitter cap layer, these layers being sequentially formed in this order. Further, an emitter electrode 10, a base electrode 11 and a collector electrode 12 are formed to the above layers as contacted therewith. In addition, reference numeral 13 denotes an insulating layer for isolating an element from the adjacent element, 14 denotes an insulating layer for isolation between electrodes, and 15 denotes a silicon oxide film.

Explanation will next be made as to how to fabricate this heterojunction bipolar transistor.

First, it is necessary to epitaxially grow semiconductor layers sequentially so as to obtain lattice matching one layer after another. As the epitaxial growth technique, there may be employed a gas source molecular-beam epitaxy (GSMBE) technique or a low-pressure organic metal chemical vapor deposition (LPMOCVD) technique.

Detailed fabricating conditions will be explained for each step in the order of its fabricating process. In the first step, an n+type InP layer 2 having an impurity Sn concentration of $2 \times 10^{18} cm^{-3}$ and a film thickness of 5000Å, an n− type InP layer 3 having an impurity Sn concentration of $5 \times 10^{16} cm^{-3}$ and a film thickness of 4500Å, and an n− type $Ga_{0.47(1-\beta)}In_{0.53+0.47\beta}As_{1-\beta}P_\beta$ layer 4 ($1 \geq \beta \geq 0$) having an impurity Sn concentration of $5 \times 10^{16} cm^{-3}$ and a film thickness of 500Å are sequentially epitaxially formed on a semi-insulating InP substrate 1. In this case, the value of $\beta$ of the layer 4 decreases from 1 to 0 from its bottom to top. Such setting of $\beta$ enables the conduction band in the base/collector junction to be smoothly joined.

Next, on the n− type $Ga_{0.47(1-\beta)}In_{0.53+0.47\beta}As_{1-\beta}P_\beta$ layer 4, a p+ type $Ga_{0.47(1-\beta)}In_{0.53+0.47\beta}As_{1-\beta}P_\beta$ layer 5 ($0 \leq \beta \leq 0.5$) having a Cd impurity concentration of $1 \times 10^{19} cm^{-3}$ and a film thickness of 1000Å is epitaxially grown. In this case, the value of $\beta$ of the layer 5 increases from 0 to 0.5 from its bottom to top. Such $\beta$ setting enables establishment of an electric field through which electrons are accelerated within the base layer 5 from the emitter toward the collector.

Subsequently, an n type $Ga_{0.47(1-\beta)}In_{0.53+0.47\beta}As_{1-\beta}P_\beta$ layer 6 ($0.5 \leq \beta \leq 1.0$) having an impurity Sn concentration of $5 \times 10^{17} cm^{-3}$ and a film thickness of 500Å is epitaxially grown on the p+ type GaInAsP layer 5. In this case, the value of $\beta$ of the GaInAsP layer 6 increases from 0.5 to 1.0 from its bottom to top, which results in that the conduction band in the base/emitter junction can be smoothly joined.

Further sequentially epitaxially grown on the N type GaInAsP layer 6 are an n type InP layer 7 having an impurity concentration of $5 \times 10^{17} cm^{-3}$ and a film thickness of 600Å, an n type $Ga_{0.47(1-\beta)}In_{0.53+0.47\beta}As_{1-\beta}P_\beta$ layer 8 ($1.0 \geq \beta \geq 0$) having an impurity concentration of $5 \times 10^{17} cm^{-3}$ and a film thickness of 100Å, and an n+ type $Ga_{0.47}In_{0.53}As$ layer 9 having an impurity concentration of $1 \times 10^{19} cm^{-3}$ and a film thickness of 300Å. The value of $\beta$ of the GaInAsP transition layer 8 decreases from 1.0 to 0 from its bottom to top, with the result that the conduction band between the the n type InP layer 7 and the n+ type GaInAs layer 9 can be smoothly joined therebetween.

In the illustrated example, the second to fourth layers form the collector, the fifth layer forms the base, the sixth to eighth layers form the emitter and the ninth layer forms the emitter cap.

An epitaxial wafer thus formed is first subjected to an ion implantation of H+ to form an insulating layer 13 for inter-element separation suitable for the substrate 1, and further subjected to an ion implantation of B+ to form an insulating layer 14 for inter-electrode separation which reaches the n+ type InP layer 2 within the transistor.

The resultant wafer is covered with a predetermined mask and then subjected to an etching process until the p+ type GaInAsP layer 5 of the base is exposed.

Thereafter, the resultant wafer is subjected on its entire surface to a chemical vapor deposition (CVD) process to form a silicon oxide film 15 and then subjected to an etching process until the etching reaches the the n+ type InP layer 2 from the wafer surface, on which a thin Au layer is formed to form a collector electrode 12.

The resultant wafer is then subjected to a window-making process for the emitter and base regions and to a formation of an emitter electrode 10 of GeAu/Au and a formation of a base electrode 11 of Cr/Au.

Figure 6:
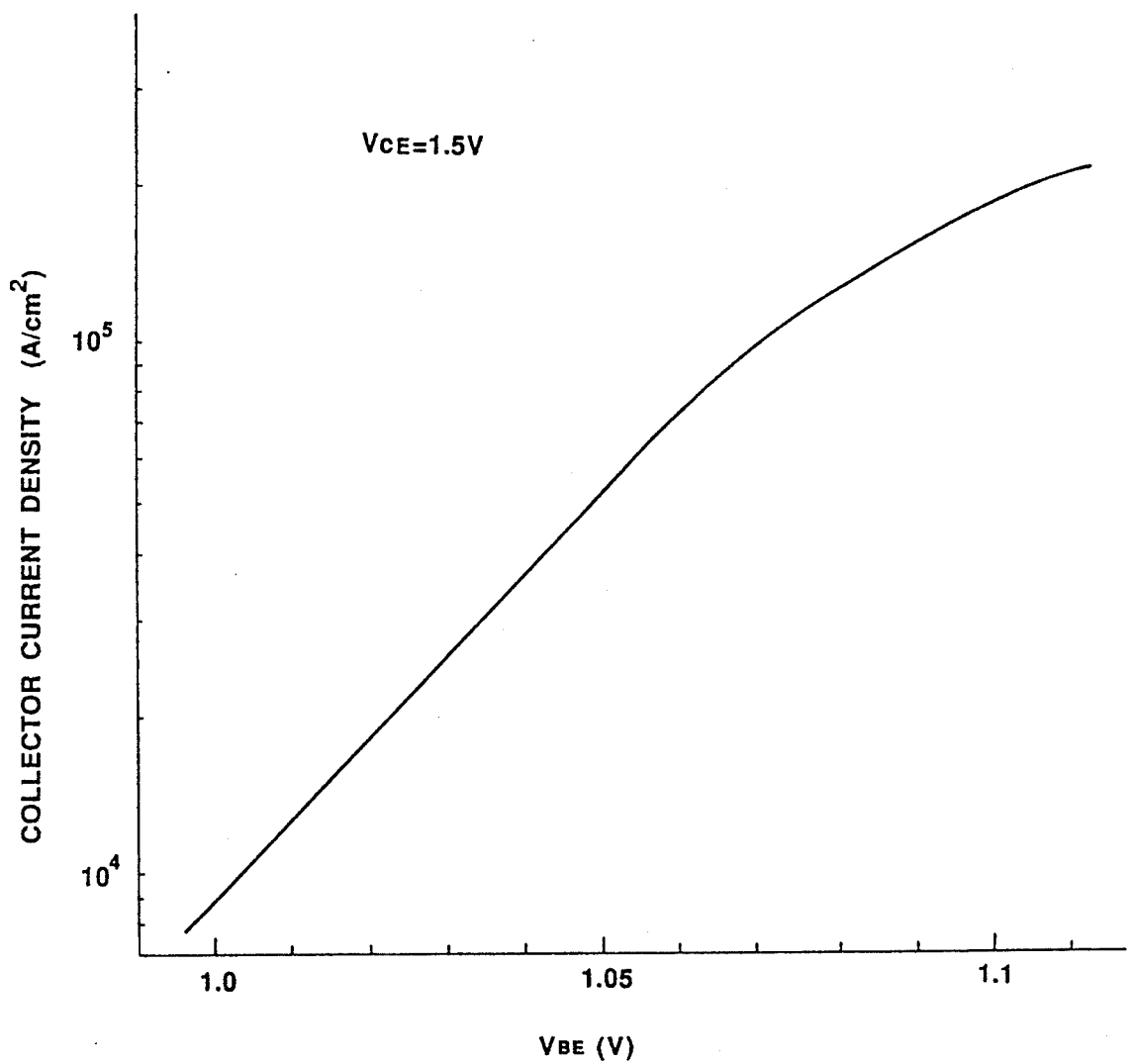
FIG. 6 is a graph illustrating current vs. voltage characteristic of the heterojunction bipolar transistor according to the embodiment of the present invention.
Figure 7:
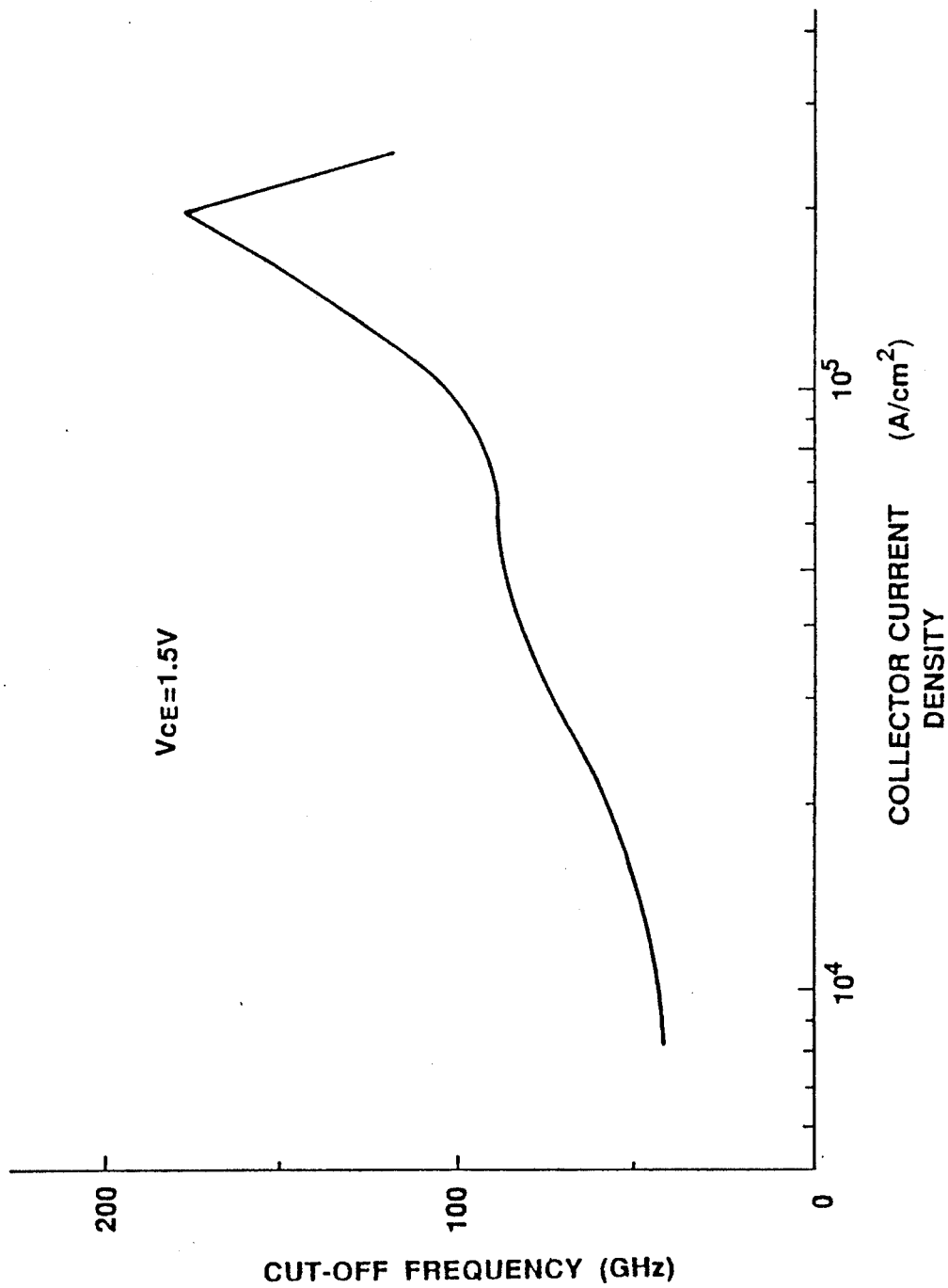
FIG. 7 is a graph illustrating cut-off frequency vs. current density characteristic of the heterojunction bipolar transistor according to the embodiment of the present invention.
Figure 8:
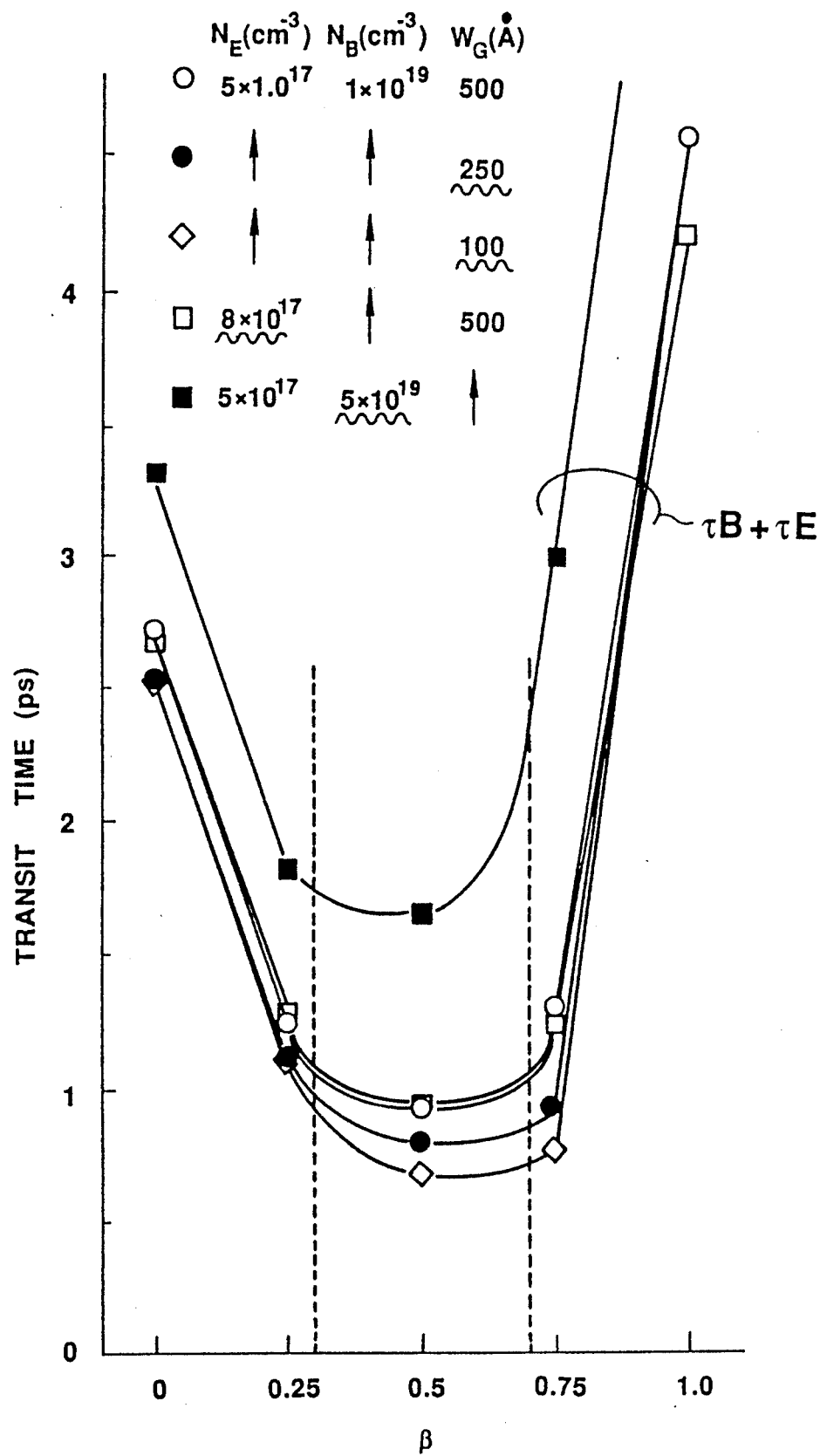
FIG. 8 is a graph illustrating InP conposition $\beta$ vs. $\tau_E + \tau_B$ when an emitter concentration $N_E$, a base concentration $N_B$ and a composition grading width $W_G$ within the emitter are varied.

A heterojunction bipolar transistor thus fabricated is subjected to a Monte-Carlo simulation, which current-/voltage characteristic and which current density dependence on the cut-off frequency $f_T$ as the simulation results are shown in FIGS. 6 and 7 respectively.

As seen from FIG. 6, the heterojunction bipolar transistor can be turned ON with a biasing voltage as a relatively low as about 1.0 V between its base and emitter.

It will be appreciated from FIG. 7 that the cut-off frequency $f_T$ takes its maximum value of 180 GHz at a collector current density $J_c$ of $2 \times 10^5 A/cm^2$ and this exhibits the sufficient advantageous effect resulting from the employment of the semiconductor composition ratio at the base/emitter junction in accordance with the present invention.

Figure 9:
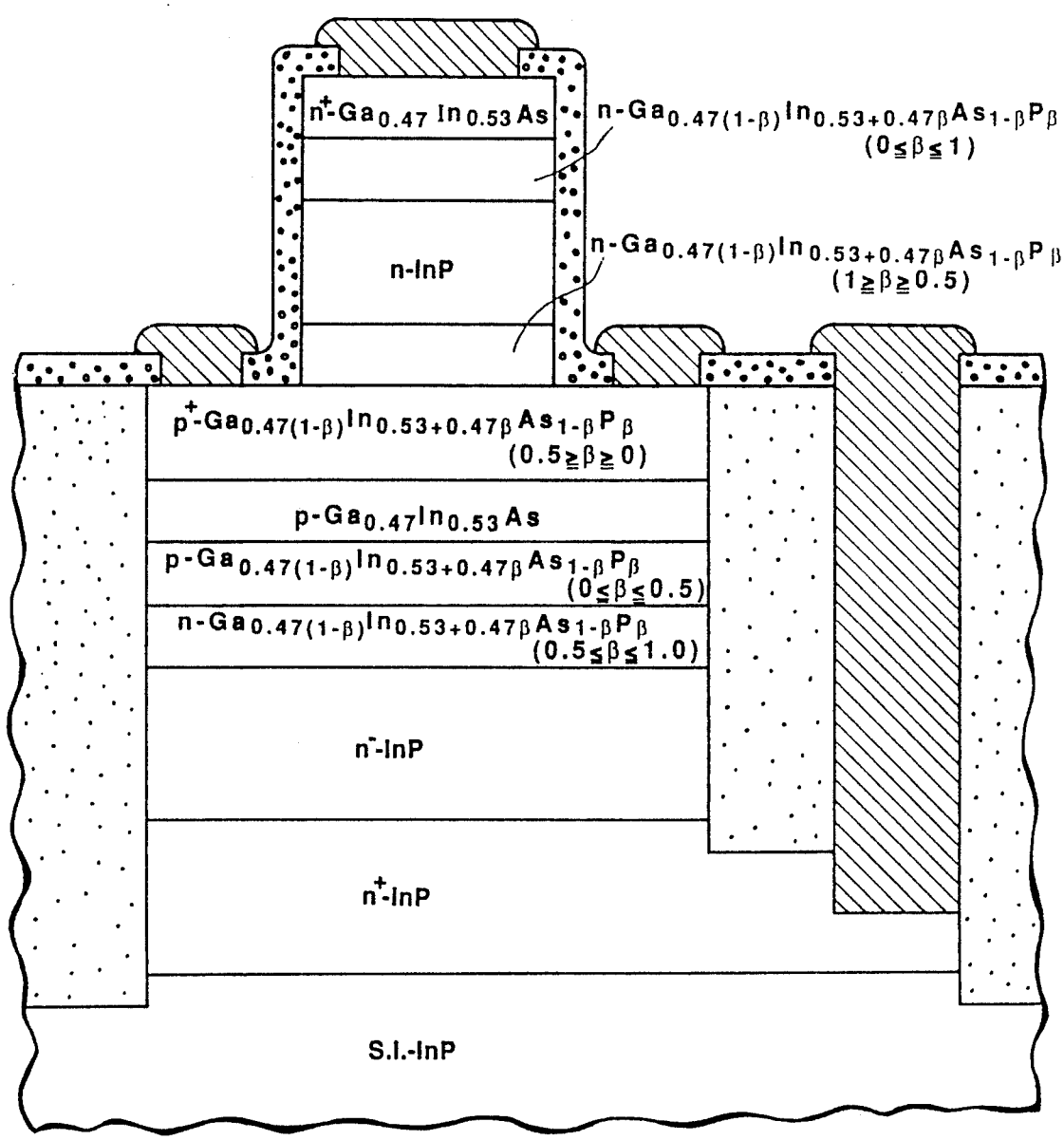
FIG. 9 is a cross-sectional view of a three-layer heterojunction bipolar transistor in accordance with another embodiment of the present invention.

Although the collector comprises the n− type InP layer and the n− type $Ga_{0.47(1-\beta)}In_{0.53+0.47\beta}As_{1-\beta}P_\beta$ layer (graded composition layers) ($1 \geq \beta \geq 0$) in the foregoing embodiment, the collector may comprise p or i type graded composition layers with substantially the same effect as the above. In the case of the p type InP collector, the impurity density and thickness of the collector must be determined in such a manner as to create depletion in normal operation, thereby to prevent any potential barrier with respect to carriers (electrons for the n type emitter) injected from the base into the collector at the base/collector junction. Further, an n, p or i type $Ga_{0.47}In_{0.53}As$ layer may be used as the collector layer. In this connection, the p type $Ga_{0.47}In_{0.53}As$ layer is not required to be depleted. In addition, a p—n type InP collector, or a $Ga_{0.47}In_{0.53}As$ collector, or a collector of three-layer structure consisting of $Ga_{0.47}In_{0.53}As/Ga_{0.47(1-\beta)}In_{0.53+0.47\beta}As_{1-\beta}P_\beta/$ InP layers may be employed. In the case of the InP collector, however, the impurity concentration and thickness of the collector must be determined so that the p layer is depleted in its normal operation as in the p type InP collector. In the case of the three-layer collector, the setting conditions are more complicated. The structure of such three-layer collector is shown in FIG. 9 in the form of a cross-sectional view, in which $Ga_{0.47(1-\beta)}In_{0.53+0.47\beta}As_{1-\beta}P_\beta$ transition layer is provided so that a band gap is smoothly joined and the value of $\beta$ of the transition layer increases from 0 to 1 from the base side to the collector side. Even in this case, for the purpose of preventing any potential barrier with respect to carriers (electrons for the n type emitter) injected from the base into the collector, attention must be paid to the position of the p—n junction in the collector. In FIG. 9, the p—n junction is present within $Ga_{0.47(1-\beta)}In_{0.53+0.47\beta}As_{1-\beta}P_\beta$ transition layer and thus the impurity concentration and thickness of a p type $Ga_{0.47(1-\beta)}In_{0.53+0.47\beta}As_{1-\beta}P_\beta$ layer 4 is set so that the layer 4 can be depleted and the generation of a potential barrier can be avoided. In addition to the above, the position of the p—n junction within the collector may be set to be within the $Ga_{0.47}In_{0.53}As$ layer, at the junction position of the $Ga_{0.47}In_{0.53}As$ layer and $Ga_{0.47(1-\beta)}In_{0.53+0.47\beta}As_{1-\beta}P_\beta$ transition layer, at the junction position of the $Ga_{0.47(1-\beta)}In_{0.53+0.47\beta}As_{1-\beta}P_\beta$ transition layer and InP layer, or within the InP layer, so long as the impurity concentration and thickness of the collector can be set to avoid the generation of a potential barrier.

Although the n+ type $Ga_{0.47}In_{0.53}As$ layer is used as the emitter cap layer in the embodiment of FIG. 9, an InP layer having a high concentration may be employed in its place. In the latter case, it is not necessary to provide the n type $Ga_{0.47(1-\beta)}In_{0.53+0.47\beta}As_{1-\beta}P_\beta$ layer 8 ($1.0 \geq \beta \geq 0$).

Furthermore, the impurity concentration and thickness of the each semiconductor layer may also be suitably changed as necessary.

It is also possible to form a laser device made of AlInGaAsP material system on the InP substrate in the form of an integrated circuit and to connect the heterojunction bipolar transistor to the integrated laser circuit to drive the laser device. In this way, since the heterojunction bipolar transistor of the present invention can be integrally formed together with such an optical element as a laser device on the common substrate, the assembly is small in the entire size and easy to fabricate. In addition, the heterojunction bipolar transistor of the present invention can be formed on the InP substrate integrally with such a field effect transistor such as a high electron mobility transistor using InP material system to obtain a compound semiconductor BIFET.

While the present invention has been disclosed with reference to the illustrated embodiments, it should be understood that the present invention is not limited to the particular embodiments disclosed, but rather includes all possible modifications within the spirit and scope of the invention as defined by the appended claims.

What is claimed is:

1. A heterojunction bipolar transistor comprising:
   a substrate;
   a collector layer formed on the substrate;
   a base layer formed on the collector layer; and
   an emitter layer made of InP having a band gap larger than that of the base layer, said emitter layer formed on the base layer and including a region extending from inside of the emitter layer to inside of the base layer, said region having a composition which varies in such a manner that a band gap is gradually decreased toward a base/collector junction,
   the base layer and a part of the emitter layer being made of GaInAsP whose composition is determined such that the base layer and the part of the emitter layer are lattice matched with InP and that a composition ratio $\beta$ of P to As in a base/emitter junction satisfies an inequality relationship $0.3 \leq \beta \leq 0.7$.

2. A heterojunction bipolar transistor as set forth in claim 1, wherein said composition ratio $\beta$ of P to As is 0.5.

3. A heterojunction bipolar transistor as set forth in claim 1, wherein said collector layer of said heterojunction bipolar transistor includes an n$^-$ type InP layer and an n$^-$ type $Ga_{0.47(1-\beta)}In_{0.53+0.47\beta}As_{1-\beta}P_\beta$ graded composition layer ($1 \geq \beta \geq 0$), and said base layer of the transistor includes a p$^+$ type $Ga_{0.47(1-\beta)}In_{0.53+0.47\beta}As_{1-\beta}P_\beta$ graded composition layer having a varying composition ratio $\beta$ starting from 0.

4. A heterojunction bipolar transistor as set forth in claim 1, wherein said collector layer of said heterojunction bipolar transistor comprises an i type InP layer.

5. A heterojunction bipolar transistor as set forth in claim 1, wherein said collector layer of said heterojunction bipolar transistor comprises a p$^-$ type InP layer.

6. A heterojunction bipolar transistor as set forth in claim 1, wherein said collector layer of said heterojunction bipolar transistor comprises an n$^-$ type $Ga_{0.47}In_{0.53}As$ layer.

7. A heterojunction bipolar transistor as set forth in claim 1, wherein said collector layer of said heterojunction bipolar transistor comprises a p$^-$ type $Ga_{0.47}In_{0.53}As$ layer.

8. A heterojunction bipolar transistor as set forth in claim 1, wherein said collector layer of said heterojunction bipolar transistor comprises an i type $Ga_{0.47}In_{0.53}As$ layer.

9. A heterojunction bipolar transistor as set forth in claim 1, wherein said collector layer of said heterojunction bipolar transistor includes an n$^-$ type InP layer and an n$^-$ type $Ga_{0.47(1-\beta)}In_{0.53+0.47\beta}As_{1-\beta}P_\beta$ graded composition layer ($1 \geq \beta \geq 0$), said base layer of the transistor comprises a p$^+$ type $Ga_{0.47(1-\beta)}In_{0.53+0.47\beta}As_{1-\beta}P_\beta$ graded composition layer ($0 \leq \beta \leq 0.5$), and said emitter layer of the transistor includes an n type $Ga_{0.47(1-\beta)}In_{0.53+0.47\beta}As_{1-\beta}P_\beta$ graded composition layer ($0.5 \leq \beta \leq 1.0$) and an n type InP layer.

10. A heterojunction bipolar transistor as set forth in claim 1, wherein said heterojunction bipolar transistor comprises an n$^+$ type InP layer as its collector contact layer formed on a semi-insulating InP substrate, an n$^-$ type InP layer and an n$^-$ type $Ga_{0.47(1-\beta)}In_{0.53+0.47\beta}As_{1-\beta}P_\beta$ layer ($1 \geq \beta \geq 0$) as its collector layers sequentially formed on said collector contact layer, a p$^+$ type $Ga_{0.47(1-\beta)}In_{0.53+0.47\beta}As_{1-\beta}P_\beta$ layer ($0 \leq \beta \leq 0.5$) as its base layer, an n type $Ga_{0.47(1-\beta)}In_{0.53+0.47\beta}As_{1-\beta}P_\beta$ layer ($0.5 \leq \beta \leq 1.0$) and an n type InP layer and an n type $Ga_{0.47(1-\beta)}In_{0.53+0.47\beta}As_{1-\beta}P_\beta$ layer ($1.0 \geq \beta \geq 0$) which form its emitter layer, and an n$^+$ type $Ga_{0.47}In_{0.53}As$ layer as its emitter cap layer.

11. A heterojunction bipolar transistor as set forth in claim 1, wherein said heterojunction bipolar transistor has a collector top structure of said emitter, base and collector layers sequentially formed on said substrate.

12. A heterojunction bipolar transistor as set forth in claim 1, wherein said heterojunction bipolar transistor comprises an Au layer as its collector electrode, a Cr/Au layer as its base electrode and a GeAu/Au layer as its emitter electrode.

13. A heterojunction bipolar transistor integrate circuit comprising:
   a substrate;
   a collector layer formed on the substrate;
   a base layer formed on the collector layer; and
   an emitter layer made of InP having a band gap larger than that of the base layer, said emitter layer formed on the base layer and including a region extending from inside of the emitter layer to inside of the base layer, said region having a composition which varies in such a manner that a band gap is gradually decreased toward a base/collector junction,
   the base layer and a part of the emitter layer being made of GaInAsP whose composition is determined such that the base layer and the part of the emitter layer are lattice matched with InP composition and that a composition ratio $\beta$ of P to As in a base/emitter junction satisfies an inequality relationship $0.3 \leq \beta \leq 0.7$.

14. A heterojunction bipolar transistor integrated circuit as set forth in claim 13, wherein said composition ratio $\beta$ of P to As is 0.5.

15. A heterojunction bipolar transistor integrated circuit as set forth in claim 13, wherein an InP semiconductor laser device is integrated on said substrate.

* * * * *